United States Patent [19]
Yamashita

[11] Patent Number: 6,150,280
[45] Date of Patent: Nov. 21, 2000

[54] ELECTRON-BEAM CELL PROJECTION APERTURE FORMATION METHOD

[75] Inventor: Hiroshi Yamashita, Tokyo, Japan

[73] Assignee: NEC Corporation, Japan

[21] Appl. No.: 09/256,710

[22] Filed: Feb. 24, 1999

[30] Foreign Application Priority Data

Feb. 26, 1998 [JP] Japan ................... 10-045656

[51] Int. Cl.[7] .................................. H01L 21/00
[52] U.S. Cl. ................ 438/707; 216/2; 216/12; 216/56; 438/719; 438/734
[58] Field of Search ................ 438/707, 710, 438/712, 719, 734; 216/2, 12, 56, 66, 79

[56] References Cited

U.S. PATENT DOCUMENTS

| | | | |
|---|---|---|---|
| 3,668,028 | 6/1972 | Short ........................... | 216/12 |
| 3,801,390 | 4/1974 | Lepselter et al. .............. | 216/12 X |
| 4,740,267 | 4/1988 | Knauer et al. ................. | 438/707 |

OTHER PUBLICATIONS

"Thermal Characteristics of Si Mask for EB cell Projection Lithography" Nakayama et al.

Jpn. J. Applied Physics, vol. 31 (1992); pp. 4268–4272, Part 1 No. 12B, Dec. 1992.

"Electron–Beam Cell Projection Lithography: A New High–Throughput Electron Beam Direct–Writing Technology Using a Specially Tailored Si Aperture"; Nakayama et al; J. Vac. Sci. Technology B8 (6); Nov./Dec. 1990; pp. 1836–1840.

*Primary Examiner*—William Powell
*Attorney, Agent, or Firm*—Hayes, Soloway, Hennessey, Grossman & Hage, P.C.

[57] ABSTRACT

The present invention provides an electron-beam cell projection aperture formation method comprising: a step of applying a converged ion beam to a top surface of a substrate so as to be etched to a depth enabling to obtain a sufficient film thickness for absorbing or scattering an electron-beam thereby to form an opening of a desired pattern on the top surface; and a step of uniformly applying the converged ion beam to a back surface of the substrate, excluding a hem portion thereof, so as to be etched to a depth reaching the opening.

12 Claims, 8 Drawing Sheets

ELECTRON-BEAM CELL PROJECTION APERTURE FORMATION METHOD

BACKGROUND OF THE INVENTION

1. Field of the Invention

The present invention relates to an electron-beam exposure apparatus component and in particular, to a cell projection aperture formation method.

2. Description of the Related Art

Semiconductor electronic parts such as a dynamic random access memory (DRAM) have been increasing their integration degree, requiring an ultra-fine processing technique. As means for implementing an ultra-fine resist pattern in a semiconductor production process, a great expectation is posed on an electron-beam exposure method employing a partial cell projection method. This exposure method uses a cell projection aperture of a Si substrate having an aperture of configuration identical to a part of a semiconductor pattern or the entire semiconductor pattern.

Conventionally, a cell projection aperture has been prepared by employing a conventional semiconductor processing technique such as resist patterning using photolithography, the etching technique using plasma, or the wet etching technique, so as to obtain a desired pattern through a Si substrate. (See Y. Nakayama, H. Satoh, et al "Thermal Characteristics of Si Mask for EB Cell Projection Lithography", Jpn. J. Applied Physics, Vol. 31 (1992), pp. 4268 to 4272, Part 1, No. 12B, December 1992 [1], and in Y. Nakayama, S. Okazaki, and N. Satoh "Electron-Beam Cell Projection Lithography: A New High-Throughput Electron Beam Direct-Writing Technology Using a Specially Tailored Si Aperture", J. Vac. Sci. Technology B8 (6), Nov/Dec 1990 [2])

More specifically, a Si substrate is firstly subjected to a plasma etching to the depth of 15 to 30 micrometers from the surface. After this, the Si substrate is subjected to a back etching so as to open a pattern from the back of the Si substrate by etching the remaining 500 to 600 micrometers.

FIG. 7 shows a cell projection aperture formation method according to the aforementioned documents [1] and [2]. Hereinafter, explanation will be given on the cell projection aperture formation method according to respective cell projection aperture formation steps.

Firstly, the Si substrate surface is spin-coated with resist 5 with a thickness of 1 micrometer, which is subjected to exposure using a g-ray or i-ray demagnification projection exposure apparatus, contact exposure apparatus, electron-beam exposure apparatus or the like, and developed to obtain a resist pattern (FIG. 7A Cell pattern exposure/development step). The Si substrate often used is a double-sided Si substrate 8 (hereinafter, referred to simply as Si substrate 8) consisting of two Si substrates 8a and 8b bonded together via a Si oxide film as an etching mask 9.

Next, using this resist 5 as an etching mask, the Si substrate 8 is plasma etched in the depth of about 20 micrometers (FIG. 7B Si etching step). Here, in order to obtain a preferable etching configuration, a Si oxide film can be used instead of the resist 5 as the etching mask. In this case, prior to the resist application, a Si oxide film is formed on the surface of the Si substrate with a thickness of about 1 micrometer using a thermal oxidation or CVD (chemical vapor deposition), after which the Si oxide film is subjected to etching through the aforementioned resist pattern for patterning of the Si oxide film. Next, the resist 5 is peeled off so that the patterned Si oxide film is used as an etching mask for etching the Si substrate 8.

Next, a nitride film 6 is formed on the top surface and the back surface of the Si substrate 8, and furthermore a resist 5 is applied. Alignment is performed with respect to the top surface pattern, and the back surface pattern is exposed and developed for patterning the resist 5 (FIG. 7C, nitride film formation, resist application/exposure/development step).

This resist pattern is used as an etching mask for etching the Si nitride film 6. After the resist is removed, using the Si nitride film 6 as an etching mask, the Si substrate 8 is subjected to 600-micrometer etching from the back surface using a KOH solution or the like. (FIG. 7D, back etching step).

Finally, the Si nitride film 6 is removed using thermal phosphoric acid, and the top surface of the Si substrate 8 is covered with a metal film such as Au as a conductive layer 7 (FIG. 7E, conductive layer formation step). The substrate is cut into a predetermined size, thus completing a cell projection aperture.

As has been described above, the conventional production method is rather complicated and requires an expensive semiconductor production apparatus and a high processing technology. There is also a problem that the yield is too low.

An ordinary demagnification ratio of a cell projection radiation type electron-beam exposure apparatus, i.e., the ratio of the dimension on a wafer against the aperture dimension is $1/10$ to $1/100$. For example, in order to obtain a 0.1-micrometer pattern on a wafer, the pattern has a width of 1 to 10-micrometers in the aperture. If a Si is to be etched to the depth of 15 to 20 micrometers for this width, the aspect ratio (ratio of depth to width) becomes 20 at maximum. Currently, this is technically difficult to obtain.

Moreover, the back etching of the Si substrate to 500 to 600 micrometers from the back surface using an etching solution such as KOH requires a long period of time because the etching rate is low. For this, the surface of the Si substrate is deteriorated by the etching solution during the etching, resulting in a low yield.

Moreover, the semiconductor device production requires a processing dimensional accuracy of 5% or below. Accordingly, the aperture processing accuracy should have a high accuracy of 0.05 to 0.5 micrometers. Furthermore, in order to allow to pass an electron-beam with a preferable configuration, the taper angle after an etching should be 89 degrees or above. Such a strict processing accuracy is difficult to obtain by the conventional technique.

Furthermore, with the conventional technique, it is difficult to form apertures having different depths. Accordingly, it is difficult to produce a cell projection aperture in which the proximity effect is compensated by differing the electron-beam transmittance at desired positions of a pattern.

SUMMARY OF THE INVENTION

It is therefore an object of the present invention to provide a cell projection aperture formation method using a converged ion beam for etching a substrate.

The electron-beam cell projection aperture formation method according to the present invention comprises: a step of applying a converged ion beam to a top surface of a substrate so as to be etched to a depth enabling to obtain a sufficient film thickness for absorbing or scattering an electron-beam thereby to form an opening of a desired pattern on the top surface; and a step of uniformly applying the converged ion beam to a back surface of the substrate, excluding a hem portion thereof, so as to be etched to a depth reaching the opening.

According to another aspect of the present invention, the electron-beam cell projection aperture formation method comprises: a step of uniformly applying a converged ion beam to a back surface of a substrate, excluding a hem portion thereof, so as to be etched to a depth enabling to obtain a sufficient film thickness for absorbing or scattering an electron-beam, and a step of applying the converged ion beam to a top surface of the substrate whose back surface has been etched, thereby to form an opening of a desired pattern.

According to still another aspect of the present invention, the electron-beam cell projection aperture formation method comprises: a step of uniformly applying a converged ion beam to a back surface of a substrate, excluding a hem portion thereof, so as to be etched to a depth enabling to obtain a sufficient film thickness for absorbing or scattering an electron-beam, and a step of further applying the converged ion beam to the back surface of the substrate which has been etched, thereby to form an opening of a desired pattern.

According to yet another aspect of the present invention, the electron-beam cell projection aperture formation method comprises: a step of applying a converged ion beam to a top surface of a substrate for etching an opening of a desired pattern having different etching depths at desired positions by etching a peripheral portion of the pattern to a depth enabling to obtain a first film thickness sufficient for absorbing or scattering an electron-beam and a center portion of the pattern to a depth enabling to obtain a second film thickness smaller than the first film thickness, and a step of applying the converged ion beam to a back surface of the substrate so as to be uniformly etched, excluding a hem portion thereof, to a depth reaching the deepest portion of the opening to form a through hole while the other portion of the opening has a thin film remaining.

According to yet still another aspect of the present invention, the electron-beam cell projection aperture formation method comprises: a step of applying a converged ion beam to a back surface of a substrate so as to be uniformly etched, excluding a hem portion thereof, to a depth enabling to obtain a sufficient thickness for absorbing or scattering an electron-beam, and a step of applying the converged ion beam to a top surface of the substrate so as to perform etching while controlling the etching depth according to a position over the substrate thereby to obtain an opening of a desired pattern having different depths in such a manner that the deepest portion of the opening is a through hole and the other portion of the opening has a thin film as a bottom of the opening.

According to still another aspect of the present invention, the electron-beam cell projection aperture formation method comprises: a step of applying a converged ion beam to a back surface of a substrate so as to be uniformly etched, excluding a hem portion of the substrate, to a depth enabling to obtain a sufficient thickness for absorbing or scattering an electron-beam, and a step of further applying the converged ion beam to the back surface of the substrate which has been etched, so as to perform etching while controlling the etching depth according to a position on the substrate thereby to obtain an opening of a desired pattern having different depths in such a manner that the deepest portion of the opening is a through hole and the other portion of the opening has a thin film as a bottom of the opening.

According to still further another aspect of the present invention, the electron-beam cell projection aperture formation method comprises: a step of applying a converged ion beam to a top surface of a substrate simultaneously with applying an etching gas to a position irradiated by the ion beam thereby to perform etching to a depth enabling to obtain a sufficient film thickness for absorbing or scattering an electron-beam and to form an opening of a desired pattern on the top surface of the substrate, and a step of applying the converged ion beam and the etching gas to a back surface of the substrate, excluding a hem portion of the substrate, thereby to perform a uniform etching to a depth reaching the opening.

According to yet another aspect of the present invention, the electron-beam cell projection aperture formation method comprises: a step of applying a converged ion beam to a back surface of a substrate simultaneously with applying an etching gas to a position irradiated by the ion beam thereby to perform a uniform etching, excluding a hem portion of the substrate, to a depth enabling to obtain a sufficient film thickness for absorbing or scattering an electron-beam, and a step of applying the converged ion beam to a top surface of the substrate whose back surface has been etched, simultaneously with application of an etching gas to a position irradiated by the converged ion beam, thereby to form an opening of a desired pattern.

According to still yet another aspect of the present invention, the electron-beam cell projection aperture formation method comprising: a step of applying a converged ion beam to a back surface of a substrate simultaneously with application of an etching gas to a position irradiated by the ion beam thereby to perform a uniform etching, excluding a hem portion of the substrate, to a depth enabling to obtain a sufficient film thickness for absorbing or scattering an electron-beam, and a step of further applying the converged ion beam to the surface of the substrate which has been etched, simultaneously with application of an etching gas to a position irradiated by the converged ion beam, thereby to form an opening of a desired pattern.

According to still another aspect of the present invention, the electron-beam cell projection aperture formation method comprises: a step of applying a converged ion beam simultaneously with application of an etching gas to a position irradiated by the converged ion beam, to a top surface of a substrate for etching an opening of a desired pattern having different etching depths at desired positions by etching a peripheral portion of the pattern to a depth enabling to obtain a first film thickness sufficient for absorbing or scattering an electron-beam and a center portion of the pattern to a depth enabling to obtain a second film thickness smaller than the first film thickness, and a step of applying the converged ion beam simultaneously with application of an etching gas to a position irradiated by the converged ion beam, to a back surface of the substrate having the opening formed, so as to uniformly etch the substrate, excluding a hem portion thereof, to a depth reaching the deepest portion of the opening to form a through hole while the other portion of the opening has a thin film remaining.

According to yet still another aspect of the present invention, the electron-beam cell projection aperture formation method comprising: a step of applying a converged ion beam simultaneously with application of an etching gas to a position irradiated by the converged ion beam, to a back surface of a substrate for uniformly etching, excluding a hem portion of the substrate, to a depth enabling to obtain a sufficient thickness for absorbing or scattering an electron-beam, and a step of applying the converged ion beam simultaneously with application of an etching gas to a position irradiated by the converged ion beam, to a top surface of the substrate so as to perform etching while controlling the etching depth according to a position over the substrate thereby to obtain an opening of a desired pattern having different depths in such a manner that the deepest portion of the opening is a through hole and the other portion of the opening has a thin film as a bottom of the opening.

According to yet another aspect of the present invention, the electron-beam cell projection aperture formation method comprises: a step of applying a converged ion beam simultaneously with application of an etching gas to a position irradiated by the converged ion beam, to a back surface of a substrate for uniformly etching, excluding a hem portion thereof, to a depth enabling to obtain a sufficient thickness for absorbing or scattering an electron-beam, and a step of further applying the converged ion beam simultaneously with application of an etching gas to a position irradiated by the converged ion beam, to the back surface of the substrate which has been etched, so as to perform etching while controlling the etching depth according to a position on the substrate thereby to obtain an opening of a desired pattern having different depths in such a manner that the deepest portion of the opening is a through hole and the other portion of the opening has a thin film as a bottom of the opening.

DESCRIPTION OF THE PREFERRED EMBODIMENTS

Hereinafter, description will be directed to preferred embodiments of the present invention with reference to the attached drawings.

[Embodiment 1]

Figure 1:
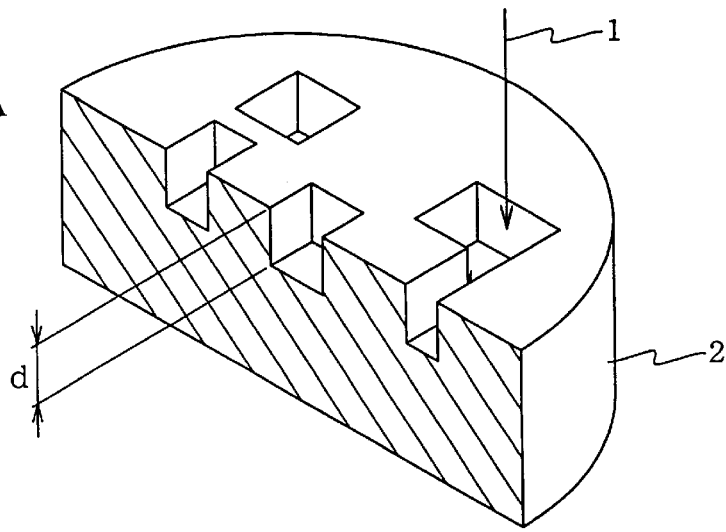
FIGS. 1(A)–1(C) are cross sectional views of a Si substrate for explanation of a first embodiment of the present invention.
Figure 1:
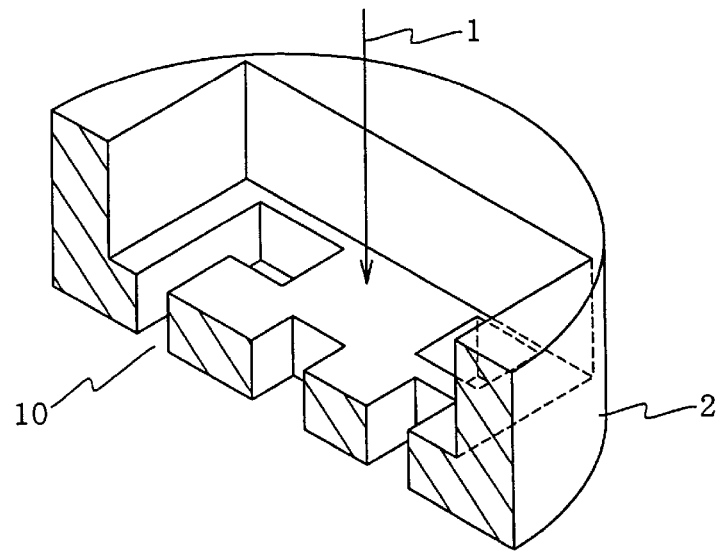
Figure 1:
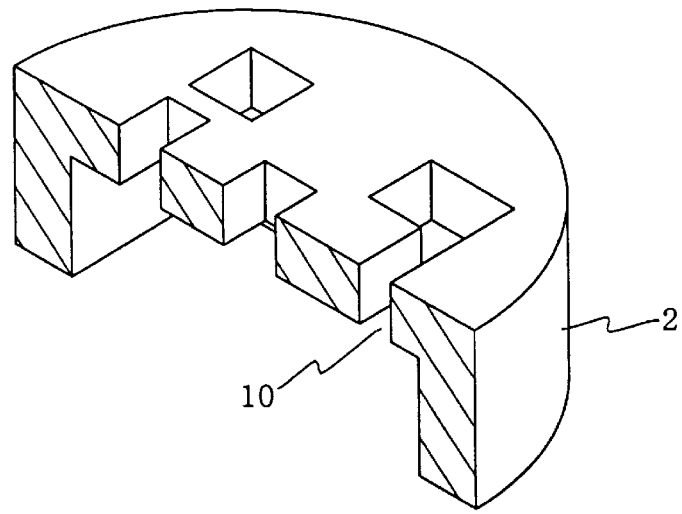
Figure 8:
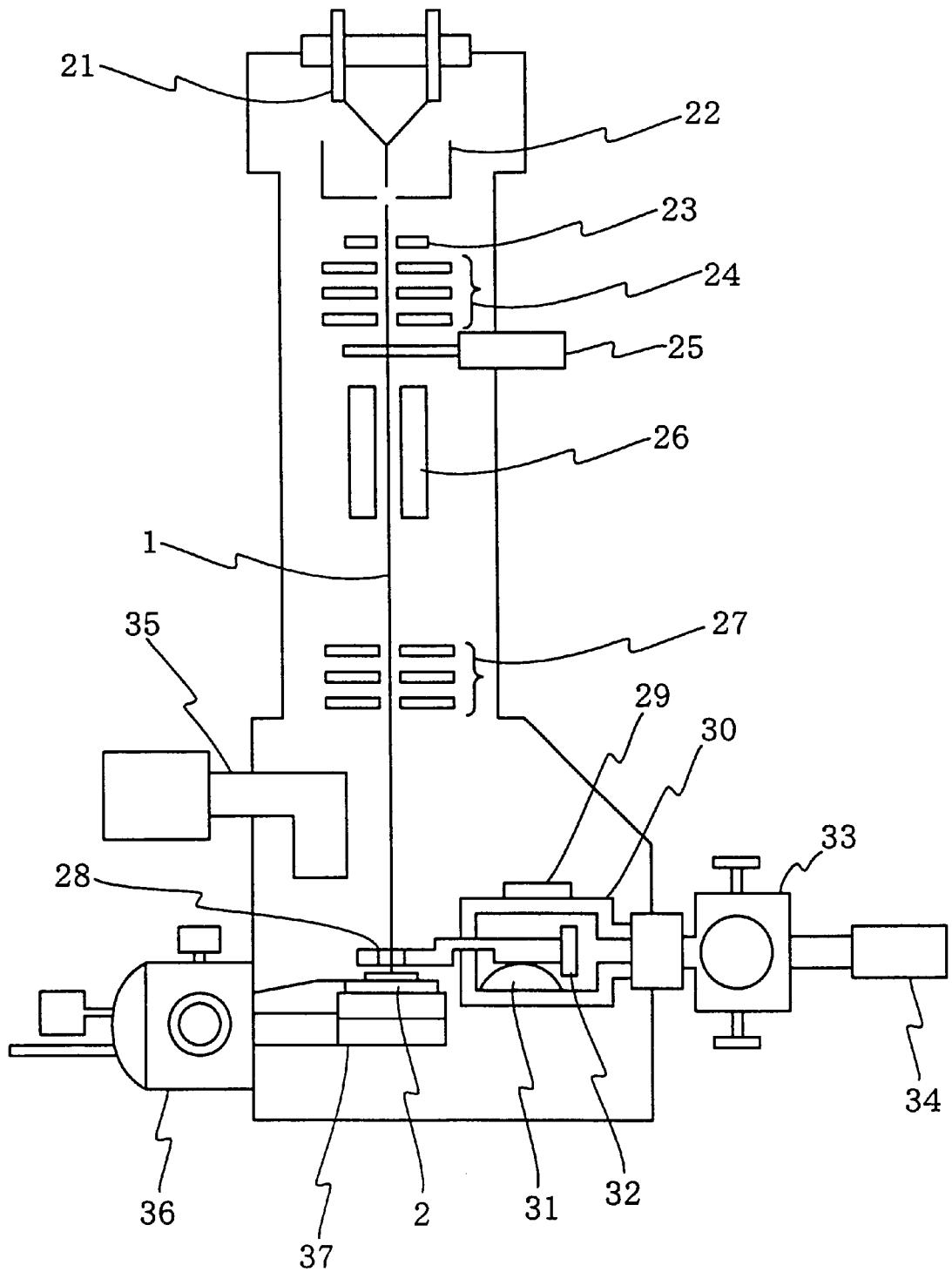
FIG. 8 schematically shows an example of converged ion beam apparatus used in the production method according to the present invention.

FIG. 1A, FIG. 1B, and FIG. 1C are perspective views of a Si substrate in different steps of the cell projection aperture formation procedure according to the first embodiment of the present invention. Moreover, FIG. 8 schematically shows an example of converged ion beam apparatus used in the first embodiment. The converged ion beam apparatus of FIG. 8 includes: an ion source (ion source 21, a shield electrode 22, a gun aperture 23), an ion converging system (converging lens 24, aperture 25, scan electrode 26, objective lens 27), a gas supply system (nozzle 28, heater 29, a reservoir 30, a gas source 31, a valve 32, a jogging device 33, a valve knob 34), a detector 35, an X-Y drive device 36, and an X-Y stage 37 for a sample.

A Si substrate 2 is placed on the X-Y stage 37 to be treated by an Ar ion beam 1 which has been emitted from the ion source 21 and converged by the converging lens 24 and the objective lens 27. For example, when forming a through hole in a 6-inch Si substrate 2 having a thickness of 620 micrometers to obtain a cell projection aperture, firstly, as shown in FIG. 1A, in an vacuum, the Ar ion beam 1 converged on the surface of the Si substrate 2 is controlled to deflect by the scan electrode 26 according to a pattern data for etching a desired pattern. Here, secondary electrons emitted from the Si substrate 2 are detected by the detector 35 and recorded as a video data to be monitored. The etching is performed with a depth d enabling to obtain a film thickness d required for completely shading an electron-beam during an electron-beam exposure.

In the first embodiment, the etching was performed to a depth of 20 micrometers. According to a simulation result, this depth of 20 micrometers enabled to obtain a sufficient film thickness to completely shade electrons in an electron-beam exposure apparatus of 50 keV acceleration voltage. The film thickness d may be smaller than the value that completely shades electrons, i.e., shallower than 20 micrometers if the electrons are absorbed and scattered resulting in an energy loss and emission angle distribution change and the electrons which have passed through the film cannot reach the Si substrate. Even if the electrons having passed through the film reach the Si substrate, there is nor problem if a sufficient contrast can be obtained. This also applies to the other embodiments which will be described later.

Next, the Si substrate 2 is placed upside down and subjected to scanning of the Ar ion beam 1 for etching to the depth of 600 micrometers from the back surface of the Si substrate 2, leaving a hem portion as it is to obtain a through opening 10 as shown in FIG. 1B. Thus, the cell projection aperture shown in FIG. 1C is complete.

Thus, according to the present invention, the converged ion beam 1 is used while being controlled to deflect according to a pattern data so as to radiate an Ar ion beam directly onto the Si substrate 2 for performing etching, without requiring resist application, development, or peeling off in the conventional method. Moreover, the back surface of the Si surface is also etched by the converged ion beam and accordingly, there is no danger of deterioration of the top surface by an etching solution for the back etching. That is, it is possible to prevent generation of a pattern defect, thus improving the yield. Furthermore, by changing the radiation angle of the converged ion beam, it is possible to change the angle of the side wall to be formed by etching. Thus by performing a vertical radiation, it is possible to obtain an aperture having an approximately vertical taper angle.

It should be noted that the aforementioned effects can also be obtained in the other embodiments which will be detailed later.

While the first embodiment has been described with deflection/scanning of the Ar ion beam, it is also possible to fix the Ar ion beam in a certain direction while driving/scanning the X-Y stage having the Si substrate 2 placed thereon using the X-Y drive device 36.

In the aforementioned first embodiment, the aperture is a through hole, but it is also possible to provide a thin film as the bottom of the aperture. That is, instead of the 20-micrometer etching from the top surface of the Si substrate, it is possible to perform a shallower etching to leave a thin film when the 600-micrometer etching is performed from the back surface. Alternatively, it is possible to perform a 20-micrometer etching from the top surface and a shallower etching than 600 micrometers from the back surface so as to leave a thin film as the bottom of the aperture. This method is advantageous when forming a coaxial pattern.

[Embodiment 2]

Figure 2:
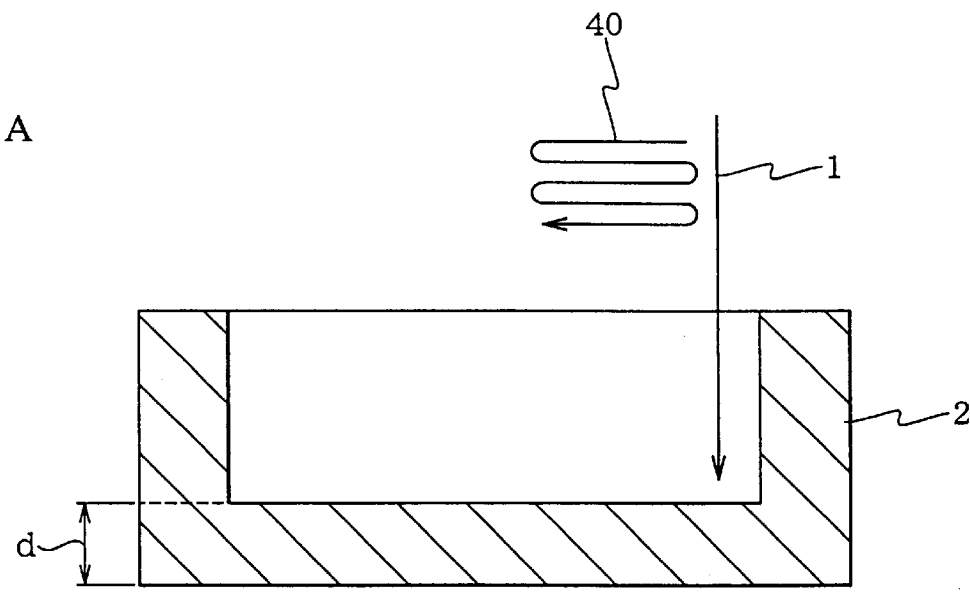
FIGS. 2(A)–2(B) are cross sectional views of a Si substrate for explanation of a second embodiment of the present invention.
Figure 2:
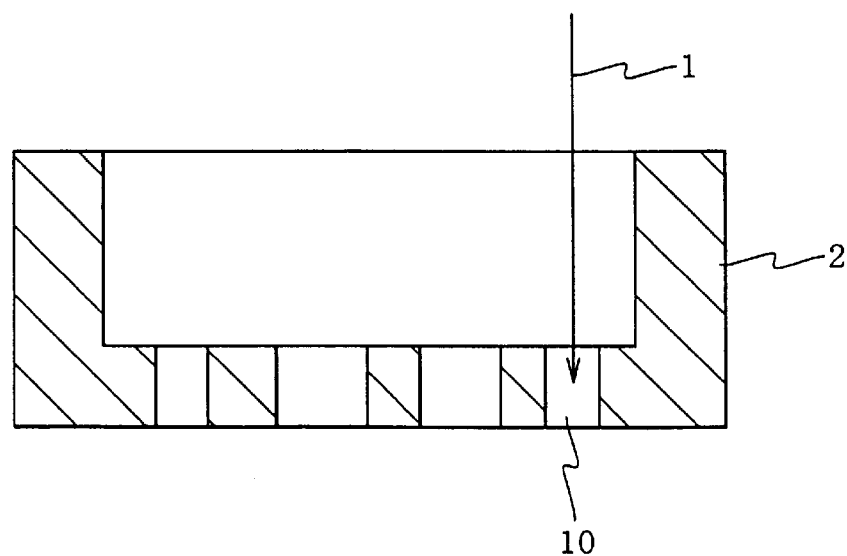

FIG. 2A and FIG. 2B are cross sectional views of a Si substrate in a cell projection aperture formation steps according to the second embodiment of the preset invention. In this embodiment, in order to protect a processed pattern on the surface of the Si substrate, firstly, etching is performed uniformly from the back surface of the Si substrate, after which etching is further performed from the back surface of the Si substrate to obtain a pattern processing on the top surface. Hereinafter, explanation will be given with reference to FIG. 2 and FIG. 8.

Firstly, a 6-inch Si substrate 2 having a thickness of 620 micrometers is placed on the X-Y stage 37 with its back surface up. As shown in FIG. 2A, by performing a raster scan the Ar ion beam 1 in a vacuum, the Ar ion beam 1 is continuously applied to the back surface of the Si substrate 2 for uniformly etching the center portion of the Si substrate 2, leaving the hem portion as it is. The etching is performed with a depth sufficient to obtain a film thickness "d" required for completing shading the electron-beam during an electron-beam exposure. In this second embodiment, the etching is performed to the depth of 600 micrometers from the back surface of the Si substrate 2, leaving a film thickness of 20 micrometers. This 20-micrometer thickness is sufficient to completely shade electrons in an electron-beam exposure apparatus of 50 keV acceleration voltage. This film thickness d may be modified in the same way as explained in the first embodiment.

Next, as shown in FIG. 2B, the Ar ion beam 1 is controlled to deflect according to a pattern data while the Ar ion beam is applied to the back surface of the Si substrate 2 so as to etch off 20 micrometers of the Si substrate 2 from the back surface. Thus an opening 10 as a through hole of a desired pattern is formed and a cell projection aperture is complete.

It should be noted that instead of deflecting-controlling the Ar ion beam 1 according to a patter data, it is possible to intermittently control the Ar ion beam 1 for raster scan in the same way as in FIG. 2A so as to radiate only the portions where the opening 10 is to be formed.

[Embodiment 3]

Figure 3:
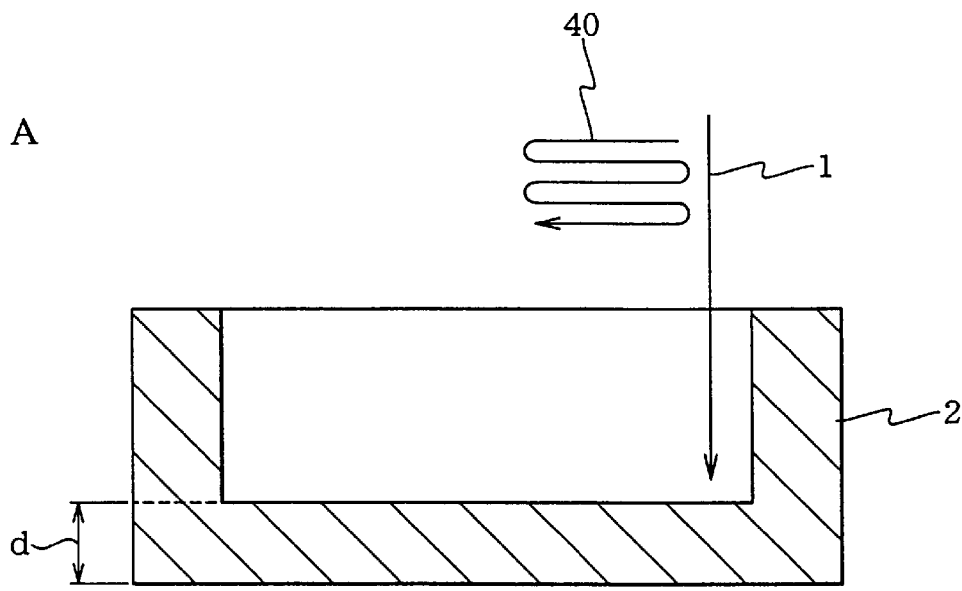
FIGS. 3(A)–3(B) are cross sectional views of a Si substrate for explanation of a third embodiment of the present invention.
Figure 3:
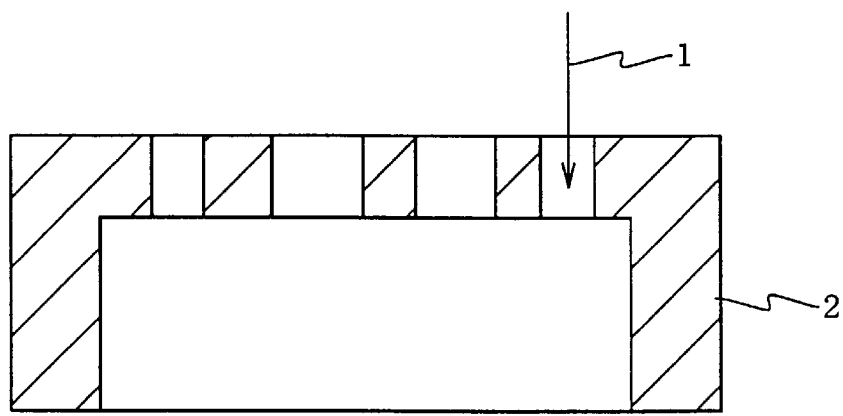

FIG. 3A and FIG. 3B are cross sectional views of a Si substrate in a cell projection aperture formation steps according to the third embodiment. In this third embodiment, similarly as in the second embodiment, in order to protect a processed pattern on the surface of the Si substrate, the back etching is performed firstly from the back surface of the Si substrate, after which the top surface is subjected to etching for pattern processing. Hereinafter, explanation will be given with reference to FIG. 3 and FIG. 8.

Firstly, a 6-inch Si substrate 2 having a thickness of 620 micrometers is placed on the X-Y stage with its back surface up. As shown in FIG. 3A, by raster-scanning the Ar beam 1 as indicated by an arrow 40, the Ar ion beam 1 is continuously applied to the back surface of the Si substrate for uniformly etching off the center portion, leaving the hem portion. The etching is performed up to a depth which is sufficient to obtain a film thickness d required for completely shading an electron-beam during an electron-beam exposure. In this third embodiment, the back etching is performed to the depth of 600 micrometers, leaving a film of 20 micrometers. This film of 20 micrometers is a sufficient film thickness for completely shading electrons in an electron-beam exposure apparatus of 50 keV acceleration voltage. This film thickness may be modified as has been explained in the first embodiment.

Next, as shown in FIG. 3B, the Si substrate is placed with its top surface up, and the Ar ion beam 1 is controlled to be deflected according to a pattern data, so that the Ar ion beam 1 is applied for etching off 20 micrometers from the top surface of the Si substrate. Thus, an opening 10 as a through hole of a desired pattern is formed, completing the cell projection aperture.

It should be noted that instead of controlling/deflecting the Ar ion beam 1 according to a pattern data, it is also possible, similarly as in FIG. 3A, to intermittently control the radiation of the Ar ion beam so as to radiate only the portion where the opening 10 is to be formed.

In the aforementioned, first, second, and third embodiments, the converged ion beam is deflected/scanned. However, it is also possible to move the X-Y stage having the Si substrate without deflecting/scanning the converged ion beam.

[Embodiment 4]

Figure 4:
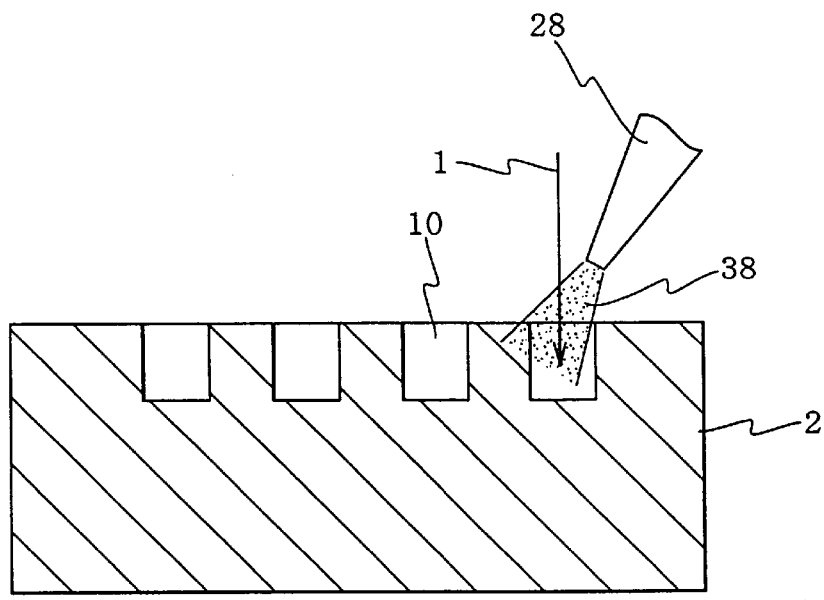
FIGS. 4(A)–4(B) are cross sectional views of a Si substrate for explanation of a fourth embodiment of the present invention.
Figure 4:
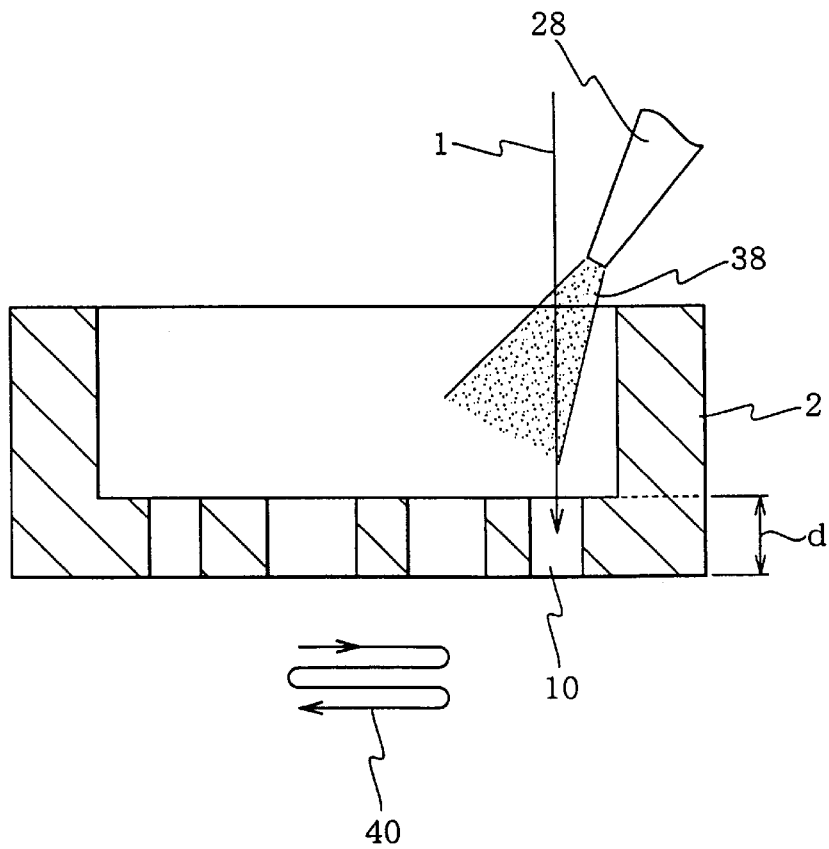

FIG. 4A and FIG. 4B are cross sectional views of a Si substrate in cell projection aperture formation steps according to the fourth embodiment. In this fourth embodiment, the Si substrate is etched by ion beam assist etching for pattern processing. Hereinafter, explanation will be given with reference to FIG. 4 and FIG. 8.

Firstly, a 6-inch Si substrate 2 having a thickness of 620 micrometers is placed with its top surface up on the X-Y stage. Without controlling to deflect the converged ion beam, the X-Y stage 37 having the Si substrate 2 is controlled to move by the X-Y drive device 36 according to a pattern data while a Ga ion beam 1 is applied to the top surface of the Si substrate 2 and a XeFe$_2$ gas 38 discharged in jet from the nozzle 28 for etching the surface of the Si substrate 2 to form an opening 10 of a desired pattern. The etching is performed to a depth d enabling to obtain a film thickness d required for completely shading electron-beams during an electron-beam exposure. In this fourth embodiment, the etching is performed to a depth of 20 micrometers from the top surface, leaving a thickness of 600 micrometers.

This thickness of 20 micrometers is a sufficient thickness for completely shading electrons in an electron-beam exposure apparatus of 50 keV acceleration voltage. This film thickness d may be modified in the same way as has been explained in the first embodiment.

As for the XeF$_2$ gas 38, XeF$_2$ is introduced into the reservoir 30 as the gas source and heated by the heater 29 to sublimate into a XeF$_2$ vapor which is discharged in jet from the nozzle 28 via the valve 32. The discharged XeF$_2$ gas 38 is dissociated by the ion beam into Xe and F$_2$, from which F$_2$ serves to etch the Si substrate 2. In this case, etching is performed by the ion sputtering in combination with the etching by the F$_2$, increasing the processing speed 10 times higher than when the ion sputtering alone is used.

Next, as shown in FIG. 4B, the Si substrate 2 is placed with its back surface up on the X-Y stage 37. The X-Y stage 37 is raster-scanned as indicated by the arrow 40 while the Ga ion beam and the XeF$_2$ gas are continuously applied to the back surface of the Si substrate, so as to perform etching to the depth of 600 micrometers from the back surface of the Si substrate, leaving the hem portion as it is. Thus, an opening 10 as a through hole of a desired pattern is formed, completing the cell projection aperture.

In the aforementioned fourth embodiment, the X-Y stage is controlled to move according to the pattern data when processing the surface of the Si substrate. This can also be replaced by raster scan of the X-Y stage for controlling to apply the Ga ion beam only to the portion where the opening 10 is to be formed. In this case, application of the XeF$_2$ gas may be controlled as gas jet ON/OFF in synchronization with the Ga ion beam, or the XeF$_2$ may be continuously applied regardless of the ON/OFF of the ion beam. Any of the methods can be selected.

[Embodiment 5]

Figure 5:
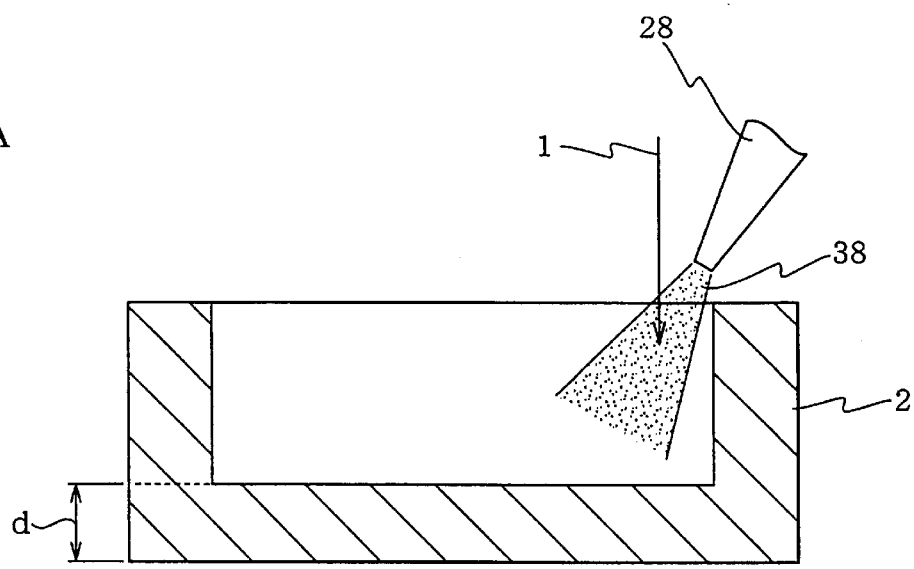
FIGS. 5(A)–5(B) are cross sectional views of a Si substrate for explanation of a fifth embodiment of the present invention.
Figure 5:
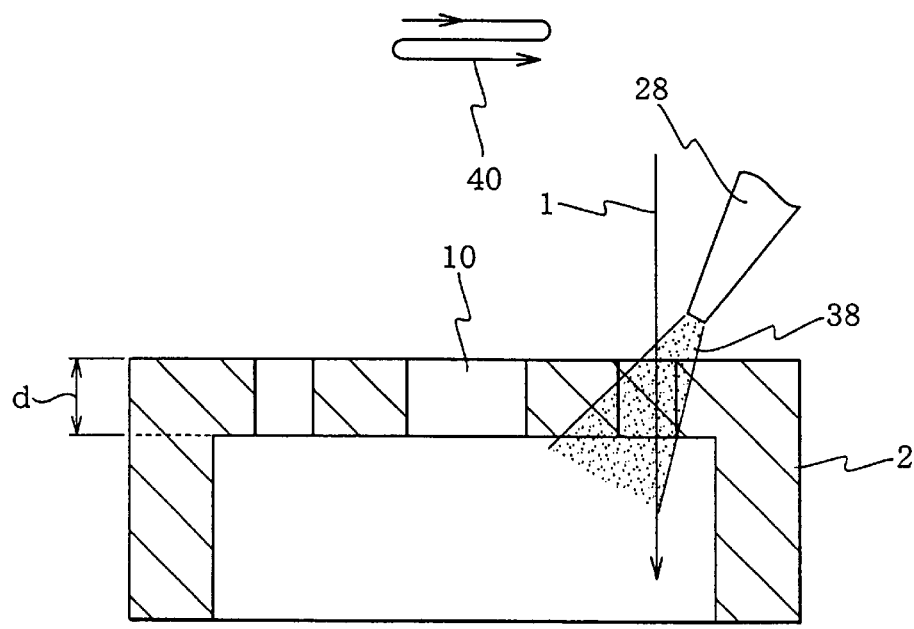

FIG. 5A and FIG. 5B are cross sectional views of a Si substrate in cell projection aperture formation steps according to the fifth embodiment. In this fifth embodiment, in order to protect the processed pattern on the Si substrate surface, firstly, etching is performed from the back surface of the Si substrate, after which the top surface is subjected to ion beam assist etching for pattern processing. Hereinafter, explanation will be given with reference to FIG. 5 and FIG. 8.

Firstly, a 6-inch Si substrate 2 having a thickness of 620 micrometers is placed with its back surface up on the X-Y stage. Without scanning the converged ion beam, the X-Y stage 37 having the Si substrate 2 is controlled to move by the X-Y drive device 36 for raster scan as shown by the arrow 40 in FIG. 5A while Ga ion beam 1 is continuously applied to the top surface of the Si substrate 2 and the XeFe$_2$ gas 38 is discharged in jet from the nozzle 28 for uniform etching of a center portion of the Si substrate 2 leaving a hem portion as it is. The etching is performed to a depth d enabling to obtain a film thickness d required for completely shading electron-beams during an electron-beam exposure. In this fifth embodiment, the etching is performed to a depth of 600 micrometers from the back surface of the Si substrate, leaving a thickness of 20 micrometers.

This thickness of 20 micrometers is a sufficient thickness for completely shading electrons in an electron-beam exposure apparatus of 50 keV acceleration voltage. This film thickness d may be modified in the same way as has been explained in the first embodiment.

Next, as shown in FIG. 5B, the Si substrate 2 is placed with its top surface up on the X-Y stage 37. The X-Y stage 37 is moved according to a pattern data while the Ga ion beam and the XeF$_2$ gas 38 are applied to the top surface of the Si substrate, so as to perform etching to the depth of 20 micrometers from the top surface of the Si substrate, leaving the hem portion as it is. Thus, an opening 10 as a through hole of a desired pattern is formed, completing the cell projection aperture.

In the aforementioned fifth embodiment, the X-Y stage is controlled to move according to the pattern data when processing the surface of the Si substrate. This can also be replaced by raster scan of the X-Y stage for controlling to intermittently apply the Ga ion beam only to the portion where the opening 10 is to be formed.

Moreover, in the above explanation, the back surface of the Si substrate is processed before processing of the top surface. However, similarly as in Embodiment 2, it is possible to perform a uniform etching of the back, which is followed by the Ga ion beam radiation and the XeF$_2$ gas application to the back surface for etching the remaining 20 micrometers into a desired pattern to obtain a through hole.

[Embodiment 6]

Figure 6A:
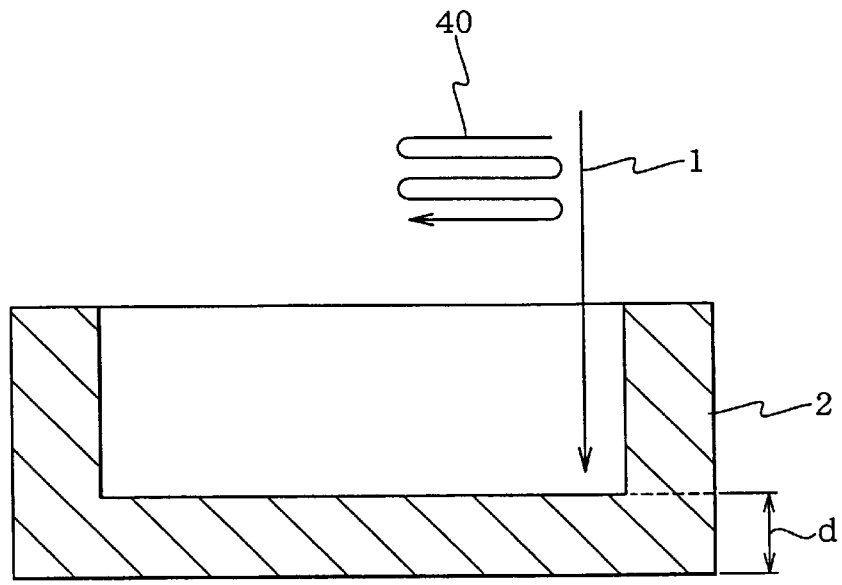
FIGS. 6(A)–6(B) are cross sectional views of a Si substrate for explanation of a sixth embodiment of the present invention.
Figure 6B:
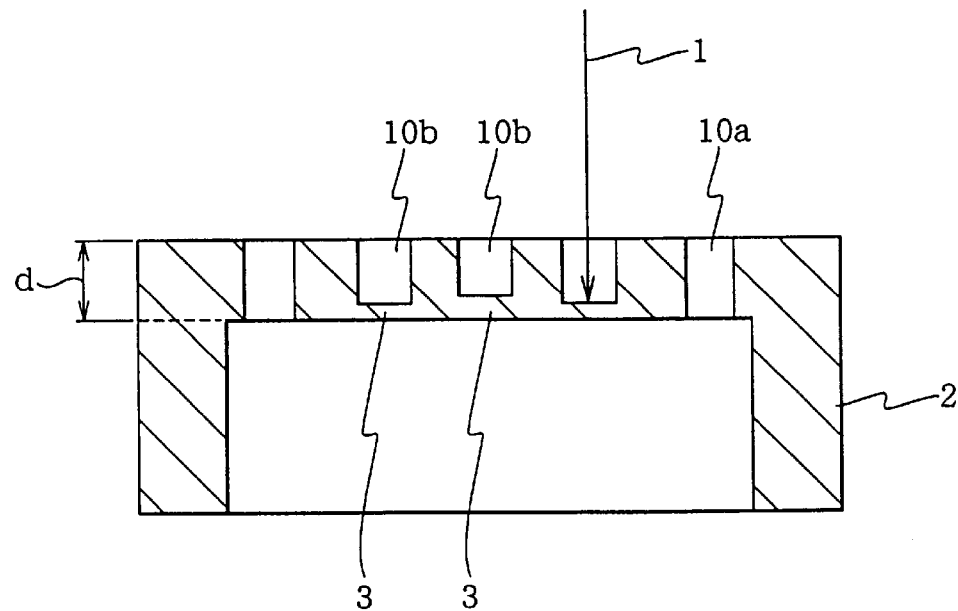
Figure 7:
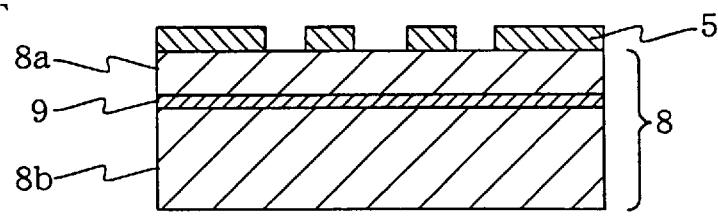
FIGS. 7(A)–7(E) are cross sectional view of a Si substrate in respective production steps of a conventional production method.
Figure 7:
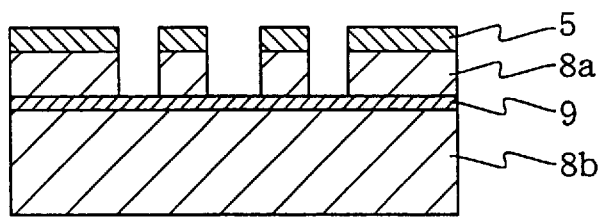
Figure 7:
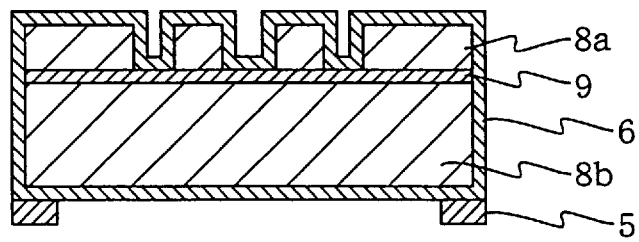
Figure 7:
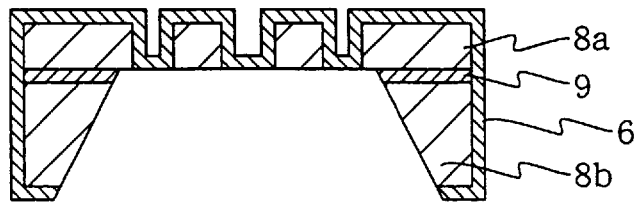
Figure 7:
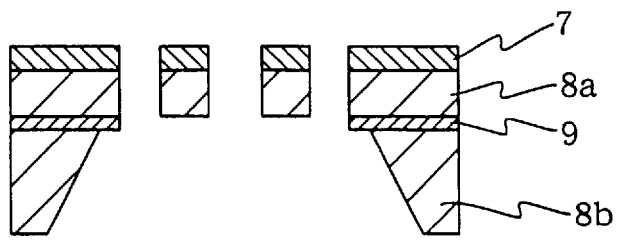

FIG. 6A and FIG. 6B are cross sectional views of a Si substrate in cell projection aperture formation steps according to the sixth embodiment. In this sixth embodiment, the depth of etching is selected as is desired and, as shown in FIG. 6B for example, a thin film 3 of an arbitrary thickness is left at the center portion of the pattern and the intensity of the electrons passing through the peripheral portion is changed so as to obtain an aperture compensating for the so-called proximity effect caused by an exposure light quantity difference due to electron back scattering between the center portion and the peripheral portions. Hereinafter, explanation will be given with reference to FIG. 6 and FIG. 8.

Firstly, a 6-inch Si substrate 2 having a thickness of 620 micrometers is placed with its back surface up on the X-Y stage. As shown in FIG. 6A, by raster-scanning the Ar ion beam 1 in a vacuum so as to be continuously applied to the back surface of the Si substrate 2. Thus, a center portion is uniformly etched, leaving the peripheral portion of the Si substrate 2. The etching is performed to a depth d enabling to obtain a film thickness d required for completely shading electron-beams during an electron-beam exposure. In this sixth embodiment, the etching is performed to a depth of 600 micrometers from the back surface of the Si substrate, leaving a thickness of 20 micrometers.

This thickness of 20 micrometers is a sufficient thickness for completely shading electrons in an electron-beam exposure apparatus of 50 keV acceleration voltage. This film thickness d may be modified in the same way as has been explained in the first embodiment.

Next, as shown in FIG. 6B, the Si substrate 2 is placed with its top surface up on the X-Y stage 37. The Ar ion beam is applied to the top surface of the Si substrate 2 according to a pattern data so as to perform etching from the top surface of the Si substrate 2 to form a desired opening pattern, thus completing a cell projection aperture.

Here, the Ar ion beam radiation time is controlled so as to change the etching depth of each of the openings in such a manner that an opening 10a in the peripheral portion of the pattern is a through hole and an opening 10b at the center portion of the pattern has a thin film 3 as a bottom. The aperture thus obtained changes the intensity of passing electrons between the peripheral portion and the center portion.

In the aforementioned sixth embodiment, as shown in FIG. 6B, the center opening 10b has the thin film 3 as its bottom which is thicker than the thin film of the adjacent openings 10b. Furthermore, the openings 10a formed outside the openings 10b are through holes. The openings 10a may also have a thin film.

Thus, the present invention performing etching using a converged ion beam can control the etching depth to a desired value. That is, an opening having different etching depths at different positions, which has been difficult to produce according to the conventional method, can easily be obtained according to this sixth embodiment.

In the sixth embodiment, etching is firstly performed to the back surface of the Si substrate. However, similarly as in the first embodiment, it is also possible to perform etching firstly to the top surface of the Si substrate to form a pattern, after which the back surface of the Si substrate is etched.

Moreover, in the sixth embodiment, the Si substrate is subjected to the back processing before the top surface is treated. However, similarly as in the second embodiment, it is also possible to uniformly etch the back surface of the Si substrate, after which the back surface is subjected to radiation the Ga ion beam for processing of the remaining 20 micrometers. That is, the etching depth is changed between the peripheral portion and the center portion of the substrate, so that the center portion has an opening with a thin film and the peripheral portion has a through hole. In this case, the thin film is formed on the top surface side of the Si substrate.

Furthermore, in the fourth and the fifth embodiment, etching may be performed while applying an etching gas such as the $XeF_2$ gas to the portion radiated by the converged ion beam.

In the aforementioned Embodiments 1 to 6, the opening was a through hole. However, as in the opening 10b, all the openings in the Embodiments 1 to 6 may have thin films.

As has thus far been described, in the cell projection aperture formation method according to the present invention, etching of a substrate is performed using a converged ion beam and accordingly there is no need of performing conventional processes of resist application, development, resist peeling off, and the like. This significantly reduces the time required for the aperture formation.

Moreover, because it is possible to control the etching depth at any position, it is possible to easily form an aperture having different etching depths depending on the position. This enables to easily form an aperture capable of compensating for the proximity effect, as well as to obtain a high processing accuracy in the order of 0.05 micrometers.

Furthermore, because the back surface of a Si substrate is also etched by the converged ion beam, there is no danger of deteriorating the top surface with an etching liquid during a back surface etching. This prevents generation of pattern defects, thus enhancing the yield.

Moreover, by changing the radiation angle of the converged ion beam, it is possible to change the angle of the side wall formed by etching. Accordingly, by applying the converged ion beam vertically, it is possible to obtain an aperture with an almost vertical taper angle. This enables to form an aperture with a large aspect ratio with a high processing dimension accuracy and to form a fine pattern.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-045656 (Filed on Feb. $26^{th}$, 1997) including specification, claims, drawings and summary are incorporated herein by reference in its entirety.

What is claimed is:

1. An electron-beam cell projection aperture formation method comprising:
    a step of applying a converged ion beam to a top surface of a substrate so as to be etched to a depth enabling to obtain a sufficient film thickness for absorbing or scattering an electron-beam thereby to form an opening of a desired pattern on said top surface; and
    a step of uniformly applying said converged ion beam to a back surface of said substrate, excluding a hem portion thereof, so as to be etched to a depth reaching said opening.

2. An electron-beam cell projection aperture formation method comprising:
    a step of uniformly applying a converged ion beam to, a back surface of a substrate, excluding a hem portion thereof, so as to be etched to a depth enabling to obtain a sufficient film thickness for absorbing or scattering an electron-beam, and
    a step of applying said converged ion beam to a top surface of said substrate whose back surface has been etched, thereby to form an opening of a desired pattern.

3. An electron-beam cell projection aperture formation method comprising:
    a step of uniformly applying a converged ion beam to a back surface of a substrate, excluding a hem portion thereof, so as to be etched to a depth enabling to obtain a sufficient film thickness for absorbing or scattering an electron-beam, and
    a step of further applying said converged ion beam to said back surface of said substrate which has been etched, thereby to form an opening of a desired pattern.

4. An electron-beam cell projection aperture formation method comprising:
    a step of applying a converged ion beam to a top surface of a substrate for etching an opening of a desired pattern having different etching depths at desired positions by etching a peripheral portion of said pattern to a depth enabling to obtain a first film thickness sufficient for absorbing or scattering an electron-beam and a center portion of said pattern to a depth enabling to obtain a second film thickness smaller than said first film thickness, and
    a step of applying said converged ion beam to a back surface of said substrate so as to be uniformly etched, excluding a hem portion thereof, to a depth reaching the deepest portion of said opening to form a through hole while the other portion of said opening has a thin film remaining.

5. An electron-beam cell projection aperture formation method comprising:
    a step of applying a converged ion beam to a back surface of a substrate so as to be uniformly etched, excluding a hem portion thereof, to a depth enabling to obtain a sufficient thickness for absorbing or scattering an electron-beam, and
    a step of applying said converged ion beam to a top surface of said substrate so as to perform etching while controlling the etching depth according to a position over said substrate thereby to obtain an opening of a desired pattern having different depths in such a manner that the deepest portion of said opening is a through hole and the other portion of said opening has a thin film as a bottom of said opening.

6. An electron-beam cell projection aperture formation method comprising:
    a step of applying a converged ion beam to a back surface of a substrate so as to be uniformly etched, excluding a hem portion of said substrate, to a depth enabling to obtain a sufficient thickness for absorbing or scattering an electron-beam, and
    a step of further applying said converged ion beam to said back surface of said substrate which has been etched, so as to perform etching while controlling the etching depth according to a position on said substrate thereby to obtain an opening of a desired pattern having different depths in such a manner that the deepest portion of said opening is a through hole and the other portion of said opening has a thin film as a bottom of said opening.

7. An electron-beam cell projection aperture formation method comprising:
    a step of applying a converged ion beam to a top surface of a substrate simultaneously with applying an etching gas to a position irradiated by said ion beam thereby to perform etching to a depth enabling to obtain a sufficient film thickness for absorbing or scattering an electron-beam and to form an opening of a desired pattern on said top surface of said substrate, and a step of applying said converged ion beam and said etching gas to a back surface of said substrate, excluding a hem portion of said substrate, thereby to perform a uniform etching to a depth reaching said opening.

8. An electron-beam cell projection aperture formation method comprising:

a step of applying a converged ion beam to a back surface of a substrate simultaneously with applying an etching gas to a position irradiated by said ion beam thereby to perform a uniform etching, excluding a hem portion of said substrate, to a depth enabling to obtain a sufficient film thickness for absorbing or scattering an electron-beam, and a step of applying said converged ion beam to a top surface of said substrate whose back surface has been etched, simultaneously with application of an etching gas to a position irradiated by said converged ion beam, thereby to form an opening of a desired pattern.

9. An electron-beam cell projection aperture formation method comprising:

a step of applying a converged ion beam to a back surface of a substrate simultaneously with application of an etching gas to a position irradiated by said ion beam thereby to perform a uniform etching, excluding a hem portion of said substrate, to a depth enabling to obtain a sufficient film thickness for absorbing or scattering an electron-beam, and a step of further applying said converged ion beam to said surface of said substrate which has been etched, simultaneously with application of an etching gas to a position irradiated by said converged ion beam, thereby to form an opening of a desired pattern.

10. An electron-beam cell projection aperture formation method comprising:

a step of applying a converged ion beam simultaneously with application of an etching gas to a position irradiated by said converged ion beam, to a top surface of a substrate for etching an opening of a desired pattern having different etching depths at desired positions by etching a peripheral portion of said pattern to a depth enabling to obtain a first film thickness sufficient for absorbing or scattering an electron-beam and a center portion of said pattern to a depth enabling to obtain a second film thickness smaller than said first film thickness, and a step of applying said converged ion beam simultaneously with application of an etching gas to a position irradiated by said converged ion beam, to a back surface of said substrate having said opening formed, so as to uniformly etch said substrate, excluding a hem portion thereof, to a depth reaching the deepest portion of said opening to form a through hole while the other portion of said opening has a thin film remaining.

11. An electron-beam cell projection aperture formation method comprising:

a step of applying a converged ion beam simultaneously with application of an etching gas to a position irradiated by said converged ion beam, to a back surface of a substrate for uniformly etching, excluding a hem portion of said substrate, to a depth enabling to obtain a sufficient thickness for absorbing or scattering an electron-beam, and a step of applying said converged ion beam simultaneously with application of an etching gas to a position irradiated by said converged ion beam, to a top surface of said substrate so as to perform etching while controlling the etching depth according to a position over said substrate thereby to obtain an opening of a desired pattern having different depths in such a manner that the deepest portion of said opening is a through hole and the other portion of said opening has a thin film as a bottom of said opening.

12. An electron-beam cell projection aperture formation method comprising:

a step of applying a converged ion beam simultaneously with application of an etching gas to a position irradiated by said converged ion beam, to a back surface of a substrate for uniformly etching, excluding a hem portion thereof, to a depth enabling to obtain a sufficient thickness for absorbing or scattering an electron-beam, and a step of further applying said converged ion beam simultaneously with application of an etching gas to a position irradiated by said converged ion beam, to said back surface of said substrate which has been etched, so as to perform etching while controlling the etching depth according to a position on said substrate thereby to obtain an opening of a desired pattern having different depths in such a manner that the deepest portion of said opening is a through hole and the other portion of said opening has a thin film as a bottom of said opening.

* * * * *